US006288669B1

(12) United States Patent
Gata

(10) Patent No.: US 6,288,669 B1
(45) Date of Patent: Sep. 11, 2001

(54) SWITCHED CAPACITOR PROGRAMMABLE GAIN AND ATTENUATION AMPLIFIER CIRCUIT

(76) Inventor: Daramana G. Gata, 2400 Westridge Dr., Plano, TX (US) 75075

( * ) Notice: Subject to any disclaimer, the term of this patent is extended or adjusted under 35 U.S.C. 154(b) by 0 days.

(21) Appl. No.: 09/353,968

(22) Filed: Jul. 15, 1999

(51) Int. Cl.$^7$ ............................ H03M 1/12; G06G 7/186; H03G 3/30
(52) U.S. Cl. ........................ 341/172; 327/554; 327/337; 330/282
(58) Field of Search ..................................... 341/172, 143, 341/150, 173; 327/554, 337, 341; 330/282

(56) References Cited

U.S. PATENT DOCUMENTS

| | | | |
|---|---|---|---|
| 4,112,384 | 9/1978 | Buchberger | 330/141 |
| 4,354,250 | 10/1982 | Lee | 364/802 |
| 4,375,625 | 3/1983 | Lee | 333/213 |
| 4,404,525 | 9/1983 | Amir et al. | 330/9 |
| 4,438,354 | 3/1984 | Hague et al. | 307/493 |
| 4,441,080 | 4/1984 | Saari | 330/86 |
| 4,441,082 | 4/1984 | Hague | 330/129 |
| 4,446,438 | 5/1984 | Chang et al. | 328/127 |
| 4,453,258 | 6/1984 | Richardson | 375/98 |
| 4,468,749 | 8/1984 | Kato et al. | 364/861 |
| 4,555,668 | 11/1985 | Gregorian et al. | 330/9 |
| 4,634,997 | 1/1987 | Tompsett et al. | 330/284 |
| 4,691,172 | 9/1987 | Fukahori et al. | 330/129 |
| 4,806,874 | 2/1989 | Michel | 330/9 |
| 4,849,662 | 7/1989 | Holberg et al. | 307/520 |
| 5,028,893 | 7/1991 | Marrah et al. | 333/173 |
| 5,087,899 | 2/1992 | Lauper | 333/81 |
| 5,157,323 | 10/1992 | Ali et al. | 323/369 |
| 5,608,345 | 3/1997 | Macbeth et al. | 327/337 |
| 5,784,016 | * 7/1998 | Nagaraj | 341/120 |
| 5,841,310 | * 11/1998 | Kalthoff et al. | 327/337 |
| 5,852,416 | * 12/1998 | Ohmi et al. | 341/144 |
| 5,929,796 | * 7/1999 | Opris et al. | 341/120 |
| 5,990,819 | * 11/1999 | Fujimori | 341/150 |

OTHER PUBLICATIONS

Sehat Sutarja, "High–Resolution Pipelined Analog–to–Digital Conversion," Memorandum No. UCB/ERL M88/27, May 2, 1988, pp. 40–43.

* cited by examiner

Primary Examiner—Michael Tokar
Assistant Examiner—James H. Cho

(57) ABSTRACT

A digitally programmable switched capacitor gain and attenuation circuit that uses the same switched capacitor array for a multitude of different gain and/or attenuation settings with a single operational amplifier is disclosed. With the top plates of the capacitors connected to the operational amplifier input, the unique switching of the bottom plates of the capacitor array elements between three voltages—the circuit output, the circuit input, or a chosen reference voltage such as a power supply midpoint voltage or a ground voltage of the circuit, makes this circuit arrangement's component area smaller and the operational amplifier's design specification less demanding for applications such as a digital camera front end analog processor.

9 Claims, 2 Drawing Sheets

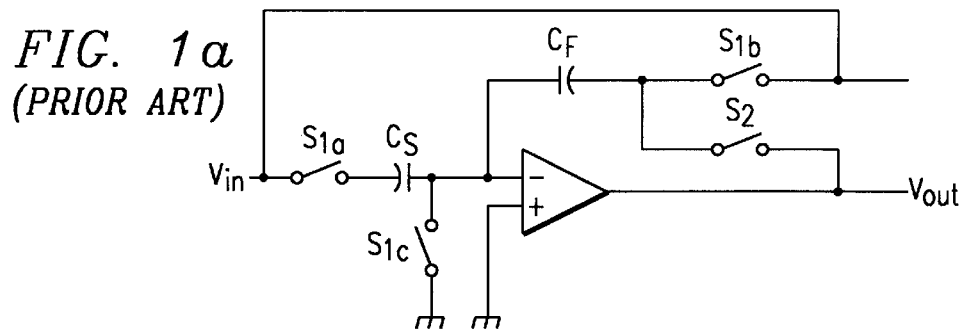
FIG. 1a
(PRIOR ART)
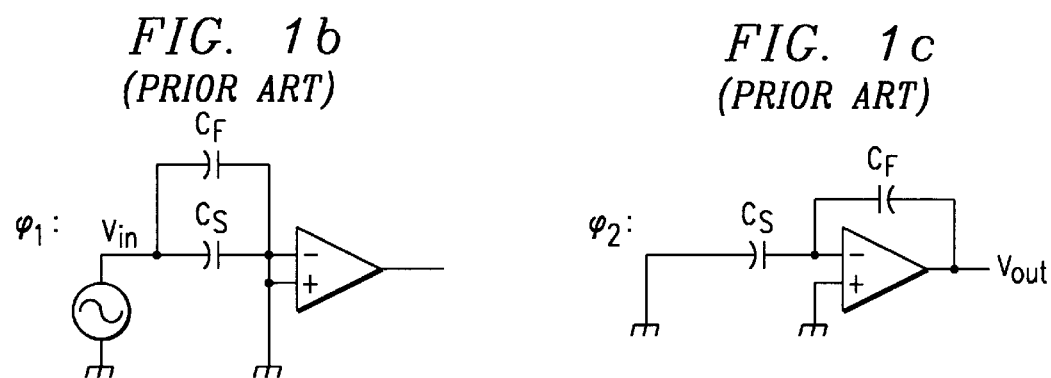
FIG. 1b
(PRIOR ART)
FIG. 1c
(PRIOR ART)
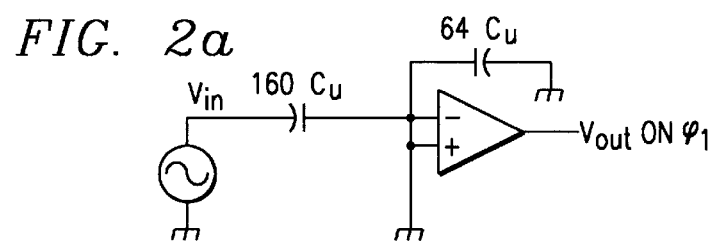
FIG. 2a
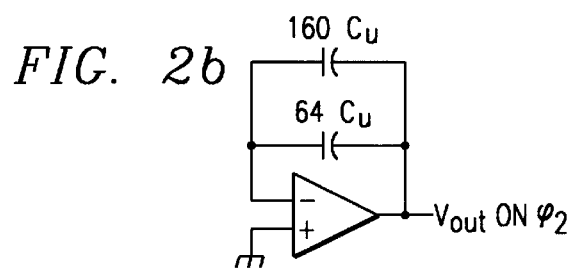
FIG. 2b

SWITCHED CAPACITOR PROGRAMMABLE GAIN AND ATTENUATION AMPLIFIER CIRCUIT

TECHNICAL FIELD OF THE INVENTION

The present invention relates generally to electronic circuits and, more particularly, to an amplifier circuit providing programmable gain and attenuation.

BACKGROUND OF THE INVENTION

Description of the Prior Art

Switched capacitor circuit stages using multi-phase clocks are found in a number of sampled analog data applications such as filters and signal conversion circuits, including analog-to-digital converters (ADCs) and digital-to-analog converters (DACs). They are additionally used in emerging technologies such as image processing in digital cameras, digital camcorders, and digital high definition televisions.

An early switched capacitor implementation of the present day fast interstage amplifier with a fixed gain of two used in pipelined ADCs is disclosed in "High-Resolution Pipelined Analog-to-Digital Conversion," by Sehat Sutarja, University of California, Berkeley, 1988, pp. 40–43, which shows a 25 percent increase in speed. The switched capacitor configuration of this reference also has the unique property that the noise gain equals the signal gain, which is different from many versions of switched capacitor gain/integrator stages where the noise gain equals the signal gain plus one. See, for example, U.S. Pat. Nos. 4,354,250, 4,404,525, 4,453,258, 4,555,668 and 5,574,457.

If one uses a switched capacitor gain stage according to the Sutarja reference for a finite signal bandwidth application, one does not need an amplifier with such a large amplifier bandwidth as compared to other switched capacitor gain stages mentioned above where one needs an amplifier with a larger bandwidth thereby expending more power for the same result. The Sutarja gain stage has one capacitor that switches the bottom plate of the capacitor from the input signal to the output of the amplifier and has another capacitor that switches the bottom plate of the capacitor from the input signal to ground. Both capacitor top plates are connected to the amplifier input and a clocked grounding switch. The first capacitor's bottom plate is never switched to ground and the second capacitor is never switched to the output. The Sutarja switched capacitor gain stage has both the capacitors equal to each other and does not do any signal attenuation only signal gain.

Attenuation circuits mainly comprise of resistors with field effect transistors used as either switches or active resistive elements such as taught in U.S. Pat. No. 5,157,323. A known switched capacitor adjustable attenuator circuit, such as shown in U.S. Pat. No. 4,468,749, uses a predetermined time to discharge a capacitor to ground in order to provide attenuation. The configuration uses a feedback capacitor that is switched from across the op amp input and output on one clock cycle to both ends grounded on the other cycle.

For a programmable gain and attenuation circuit, it would be advantageous for a single switched capacitor circuit to provide both gain and attenuation in the same embodiment, and without using FETs and resistors for attenuation. Furthermore, it would be desirable to minimize the power expended by an operational amplifier in such an arrangement for gain settings.

SUMMARY OF THE INVENTION

It is an object of the present invention to provide a programmable gain and attenuation circuit in which both gain and attenuation are provided by the same capacitor array.

It is also an object of the present invention to provide a programmable gain and attenuation circuit which does not require the use of FETs and resistors for attenuation.

It is further an object of the present invention to provide a programmable gain and attenuation circuit which minimizes the power expended by the operational amplifier for gain settings.

BRIEF DESCRIPTION OF THE DRAWINGS

The foregoing features of the present invention may be more fully understood from the detailed description, read in conjunction with the accompanying drawings, wherein:

FIGS. 1a, 1b and 1c illustrate gain stage switching in accordance with the prior art;

FIGS. 2a and 2b illustrate a novel switching arrangement of the capacitors of FIG. 1a to provide attenuation in accordance with the present invention;

DESCRIPTION OF THE PREFERRED EMBODIMENT

FIG. 1a illustrates a gain stage in accordance with the prior art. This gain stage switches both the input and feedback capacitors on different clock phases to provide gain. On clock phase$_{\phi 1}$, when switches $S_{1a}$, $S_{1b}$ and $S_{1c}$ are closed and switch $S_2$ is open, the bottom plates of input capacitance $C_S$ and feedback capacitance $C_F$ are charged to voltage $V_{in}$, as shown in FIG 1b. On clock phase $_{\phi 2}$, when switches $S_{1a}$, $S_{1b}$ and $S_{1c}$ are open and switch $S_2$ is closed, the bottom plate of $C_F$ is switched from the input to the output around the amplifier and is charged to voltage $V_{out}$, while the bottom plate of $C_S$ is switched to ground, as shown in FIG. 1c. The gain is expressed as $$\text{GAIN} = V_{out}/V_{in} = (C_S + C_F)/C_F.$$

Since $C_S$ is always greater than zero, the circuit of FIG. 1a always provides gain.

In accordance with the present invention, attenuation can be provided by first charging the $C_S$ and $C_F$ capacitors, then, in addition to all of the $C_S$ and $C_F$ capacitors, additional capacitors are switched in to give $C_F$ capacitance on phase $_{\phi 2}$ around the amplifier.

Figure 3:
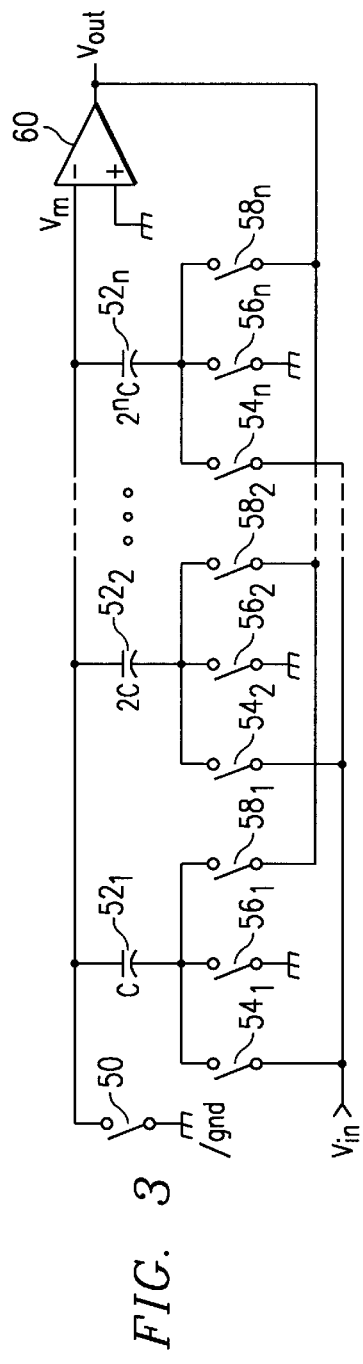
FIG. 3 illustrates a portion of an array of capacitors in a single-ended configuration in accordance with the present invention.

FIGS. 2a and 2b illustrate an example demonstrating the operation of the present invention. Referring to FIG. 2a, 160-$C_{UNIT}$ capacitors are charged during phase$_{\phi 1}$ to voltage $V_{in}$, while 64-$C_{UNIT}$ capacitors are idle with ground on both ends, with zero charge across the capacitors. On phase $_{\phi 2}$, both the 160-$C_{UNIT}$ capacitors and the 64-$C_{UNIT}$ capacitors are switched around the amplifier, with no capacitors switched to ground, as in the gain case. This gives a gain of $$\text{GAIN} = (C_s + C_F)/C_F = (224-64)/224 = 160/224 = 0.714,$$

which is less than one, thereby providing attenuation, Thus, using the same array capacitors, attenuation can be provided by a gain stage simply by switching the capacitors differently. This may be extended to any arbitrary sized array to give both attenuation and gain if the unit values are chosen so that the composition of all the attenuation units are switched around the operational amplifier and the sum of the capacitors gives the correct final value for the desired attenuation. In order to have linear gain in dB in any N×N array, the capacitor array is configured as in. FIG. 3. The array capacitor has either $V_{in}$, $V_{out}$ or $V_{ground}$ connected, based on the proper decoding for gain or attenuation.

With the top plates of the capacitors connected to the operational amplifier input, the unique switching of the bottom plates of the capacitor array elements between three voltages—the circuit output, the circuit input, or a chosen reference voltage such as a power supply midpoint voltage or a ground voltage of the circuit, makes this circuit arrangement's component area smaller and the operational amplifier's design specification less demanding for applications such as a digital camera front end analog processor.

Figure 4:
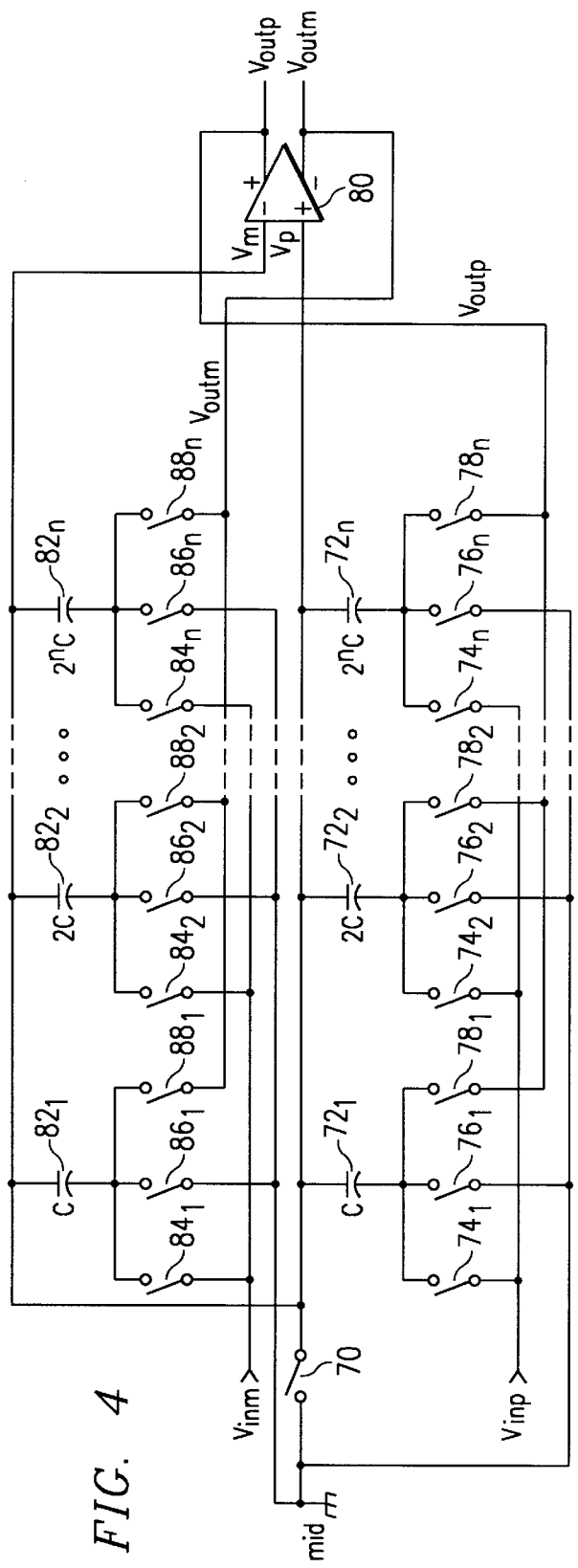
FIG. 4 illustrates a portion of arrays of capacitors in a double-ended configuration in accordance with the present invention.

FIG. 3 illustrates a portion of an array of capacitors in a single-ended configuration in accordance with the present invention; and FIG. 4 illustrates a portion of arrays of capacitors in a double-ended configuration in accordance with the present invention.

While the principles of the present invention have been demonstrated with particular regard to the structures and methods disclosed herein, it will be recognized that various departures may be undertaken in the practice of the invention. The scope of the invention is not intended to be limited to the particular structures and methods disclosed herein, but should instead be gauged by the breadth of the claims which follow.

What is claimed is:

1. A programmable switched capacitor gain and attenuation circuit comprising:

an operational amplifier;

N capacitors, each of the N capacitors having a top plate coupled to a first input of the operational amplifier, wherein N is an integer greater than one;

N switching networks, each of the N switching networks is coupled to a corresponding bottom plate of a corresponding one of the N capacitors, each of the N switching networks is operable to switch the corresponding bottom plate to any one of a first input node, a first output of the operational amplifier, and a common node; and M capacitors each having a top plate coupled to a second input of the operational amplifier, wherein M is equal to N.

2. The circuit of claim 1 further comprising a switch coupled between the first input of the operational amplifier and the common node.

3. The circuit of claim 2 further comprising a second input of the operational amplifier coupled to the common node.

4. The circuit of claim 1 further comprising a second input of the operational amplifier coupled to the common node.

5. The circuit of claim 4 wherein the first input of the operational amplifier is a negative input and the second input of the operational amplifier is a positive input.

6. The circuit of claim 1 further comprising M switching networks, each of the M switching networks is coupled to a corresponding bottom plate of a corresponding one of the M capacitors, each of the M switching networks is operable to switch the corresponding bottom plate to any one of a second input node, a second output of the operational amplifier, and the common node.

7. The circuit of claim 6 further comprising a switch coupled between the common node and the first and second input of the operational amplifier.

8. The circuit of claim 6 wherein the first input of the operational amplifier is a negative input, the second input of the operational amplifier is a positive input, the first output of the operational amplifier is a negative output, and the second output of the operational amplifier is a positive output.

9. The circuit of claim 1 further comprising a switch coupled between the common node and the first and second input of the operational amplifier.

* * * * *